(12) United States Patent
Huang (10) Patent No.: US 10,748,611 B2
(45) Date of Patent: Aug. 18, 2020

(54) RESISTIVE RANDOM ACCESS MEMORY DEVICE AND METHOD FOR PERFORMING MEMORY OPERATIONS

(71) Applicant: Winbond Electronics Corp., Taichung (TW)

(72) Inventor: Koying Huang, San Jose, CA (US)

(73) Assignee: Windbond Electronics Corp., Taichung (TW)

( * ) Notice: Subject to any disclaimer, the term of this patent is extended or adjusted under 35 U.S.C. 154(b) by 53 days.

(21) Appl. No.: 16/178,602

(22) Filed: Nov. 2, 2018

(65) Prior Publication Data

US 2020/0143878 A1     May 7, 2020

(51) Int. Cl.
*G11C 8/08* (2006.01)
*G11C 13/00* (2006.01)

(52) U.S. Cl.
CPC ........ *G11C 13/004* (2013.01); *G11C 13/0069* (2013.01); *G11C 13/0097* (2013.01)

(58) Field of Classification Search
CPC .................................................. G11C 13/0069
USPC ........................................................ 365/148
See application file for complete search history.

(56) References Cited

U.S. PATENT DOCUMENTS 7,920,405 B2    4/2011 Kang et al.
9,633,726 B2    4/2017 Park et al.
2009/0122593 A1*  5/2009 Cho .................... G11C 8/08
                                                                 365/148
2015/0278681 A1   10/2015 Saxena
2016/0155505 A1    6/2016 Lin et al.

FOREIGN PATENT DOCUMENTS

CN     105448332    3/2016
TW     I595486      8/2017

OTHER PUBLICATIONS

"Office Action of Taiwan Counterpart Application", dated Jul. 3, 2019, pp. 1-11.

* cited by examiner

*Primary Examiner* — Jason Lappas
(74) *Attorney, Agent, or Firm* — JCIPRNET (57) ABSTRACT

A resistive random access memory device which includes a resistive random access memory array, a sense amplifier and a boosting circuit. The sense amplifier is coupled to the resistive random access memory array and is configured to sense a resistance value of the memory cell. The boosting circuit is coupled to the memory cell of the resistive random access memory array and is configured to boost a reset voltage in a boosting period of a reset period according to the resistance value of the memory cell. The boosting period is from beginning of the reset period, and the memory cell is biased with the reset voltage in the reset period to perform the reset operation. A method for a reset operation on a resistive random access memory device is also introduced.

18 Claims, 11 Drawing Sheets

RESISTIVE RANDOM ACCESS MEMORY DEVICE AND METHOD FOR PERFORMING MEMORY OPERATIONS

BACKGROUND OF THE INVENTION

1. Field of the Invention

The invention relates to a non-volatile semiconductor memory device, and particularly relates to a resistive random access memory (RRAM) device and a method for performing memory operations on the RRAM device.

2. Description of Related Art

Non-volatile semiconductor memory devices, especially RRAM devices are applied to a wide variety of electronic equipment, such as computer, digital camera, smartphone, and the like. A RRAM device includes a plurality of RRAM cells which are configured to store information according to the resistance value of the RRAM cells. For example, a low resistance state of a RRAM cell corresponds to a logic value "1" and a high resistance state of the RRAM cell corresponds to a logic value "0". To change the resistance state of a specific RRAM cell from the low resistance state to the high resistance state, the RRAM device performs a reset operation on the specific RRAM cell by applying a reset voltage on the resistive element of the specific RRAM cell.

However, when the resistance value of the specific RRAM is too small, the reset voltage may not be large enough to trigger the reset operation. As a result, the reset operation fails to be executed, and the performance and reliability of the RRAM device are reduced.

Along with the popularity of RRAM devices, it is desirable to have a RRAM device and an operative method that are capable of resolving the above issue and improving the performance and reliability of the RRAM device.

SUMMARY OF THE INVENTION

This invention introduces a method for a reset operation on a resistive random access memory device and a resistive random access memory device which are capable of improving the performance and reliability of the RRAM device.

The method includes steps of sensing a resistance value of a memory cell of the resistive random access memory device; boosting a reset voltage in a boosting period of a reset period according to the resistance value of the memory cell to generate a boosted reset voltage, wherein the boosting period is from beginning of the reset period; and biasing the memory cell with the boosted reset voltage in the reset period to perform the reset operation.

The resistive random access memory device includes a resistive random access memory array, a sense amplifier and a boosting circuit. The sense amplifier is coupled to the resistive random access memory array and is configured to sense a resistance value of the memory cell. The boosting circuit is coupled to the memory cell of the resistive random access memory array and is configured to boost a reset voltage in a boosting period of a reset period according to the resistance value of the memory cell. The boosting period is from beginning of the reset period, and the memory cell is biased with the reset voltage in the reset period to perform the reset operation.

In embodiments of the invention, the reset voltage applied for performing a reset operation on a memory cell is boosted according to the resistance value of the memory cell. In this way, even if the resistance value of the memory cell is small, the reset voltage is boost to be large enough to trigger the reset operation of the memory cell.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
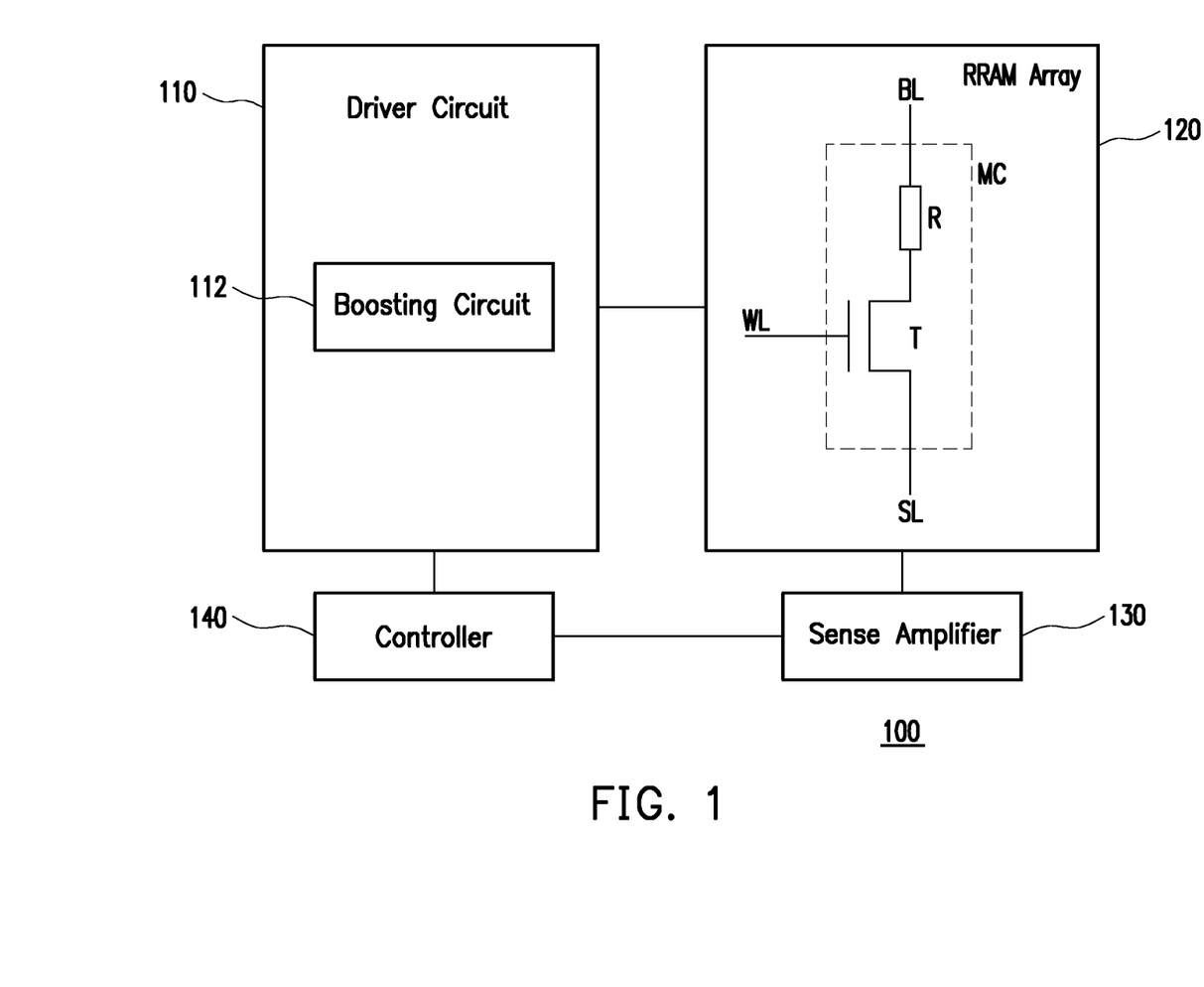
FIG. 1 is a schematic diagram illustrating a RRAM device according to an embodiment of the invention.

Referring to FIG. 1, a RRAM device 100 includes a driver circuit 110, a RRAM array 120, a sense amplifier 130 and a controller 140. The RRAM array 120 includes a plurality of RRAM cells MC which are configured to store information based on the resistance values of the RRAM cells. Each of the RRAM cells MC is coupled to a bit line BL, a word line WL and a source line SL, where the memory operations performed on the RRAM cells MC are controlled by using the bit line BL, the word line WL and the source line SL. In an embodiment of the invention, each of the RRAM cells MC may include a transistor T and a resistive element R, but the invention is not limited to any structure of the RRAM cell.

The sense amplifier 130 is coupled to the RRAM array, and is configured to sense the logic state (e.g., logic state "1" or logic state "0") stored in the RRAM cells MC. For example, the sense amplifier 130 may sense the resistance value stored in each of the RRAM cells MC to determine the logic state of the RRAM cell.

The driver circuit 110 is configured to drive the RRAM cells MC of the RRAM array 120. To driver a selected RRAM cell, the driver circuit 110 may provide a bit-line voltage, a word-line voltage and a source-line voltage to the selected RRAM cell. The values of the bit-line voltage, word-line voltage and bit-line voltage are determined according to an operation to be performed on the selected RRAM cell. The driver circuit 110 may include a boosting circuit 112 which is configured to adjust at least one of the word-line voltage, bit-line voltage and source-line voltage applied to the RRAM cell. For example, in a reset operation of a selected RRAM cell, the boosting circuit 112 may boost the reset voltage applied to the selected RRAM cell by adjusting at least one of the word-line voltage, bit-line voltage and source-line voltage applied to the selected RRAM cell.

In FIG. 1, the boosting circuit 112 is included in the driver circuit 110, but the invention is not limited thereto. The boosting circuit 112 may be disposed outside the driver circuit 110 and be coupled to the driver circuit 110. The boosting circuit 112 may receive the word-line voltage, bit-line voltage and source-line voltage from the driver circuit 110 and is configured to adjust the received word-line voltage, bit-line voltage and source-line voltage.

FIG. 1 shows only one driver circuit 110 and one boosting circuit 112, but the invention is not limited to any number of the driver circuit 110 and the boosting circuit 112. In an embodiment, the RRAM device 100 may include multiple driver circuits 110, where each of the driver circuits 110 includes at least one boosting circuit 112. Each of the boosting circuits 112 is configured to control at least one of the RRAM cells simultaneously. In this way, multiple RRAM cells may be driven simultaneously with a boosted reset voltage according to the resistance value of each of the multiple RRAM cells.

The controller 140 is coupled to the driver circuit 110 and the sense amplifier 130, and is configured to control the memory operations applied to the RRAM cells MC. For example, the controller 140 may control the driver circuit 110 to supply at least one of word-line voltage, bit-line voltage and source-line voltage to RRAM cells of the RRAM array 120. The controller 140 may be a programmable hardware processor, microprocessor, and the like.

Figure 2:
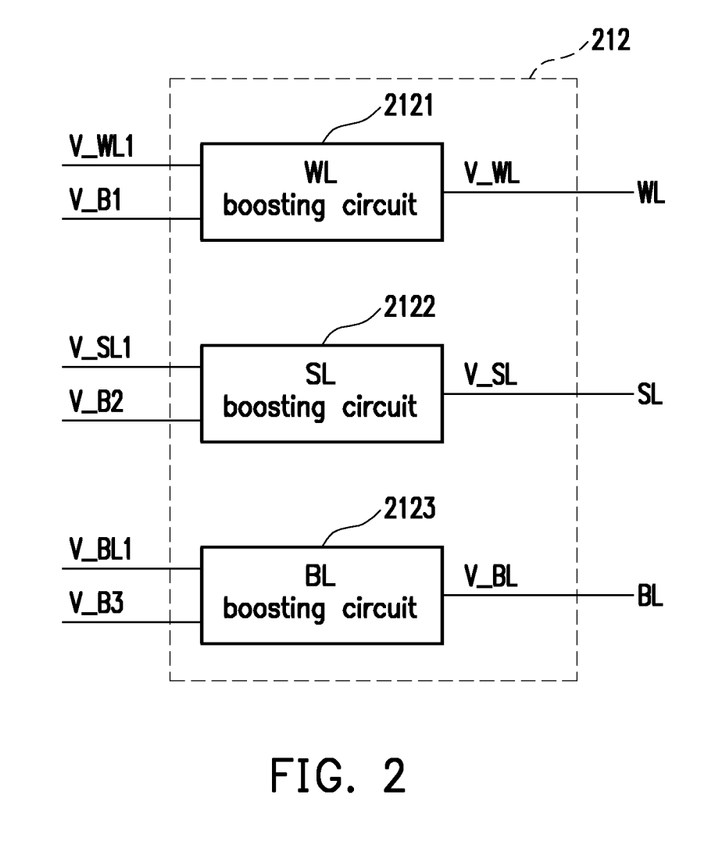
FIG. 2 is a schematic diagram illustrating a boosting circuit of a RRAM device according to an embodiment of the invention.

Referring to FIG. 2, a boosting circuit 212 may include a world-line (WL) boosting circuit 2121, a source-line (SL) boosting circuit 2122 and a bit-line (BL) boosting circuit 2123. The WL boosting circuit 2121 is configured to adjust the WL voltage applied to at least one RRAM cell being connected to the WL boosting circuit 2121. Particularly, the WL boosting circuit 2121 adjusts the WL voltage according to an inputted WL voltage V_WL1 and an inputted boosting voltage V_B1 to output an output WL voltage V_WL. The output WL voltage V_WL is provided to the WL of the at least one RRAM cell.

The SL boosting circuit 2122 is configured to adjust the SL voltage applied to at least one RRAM cell being connected to the SL boosting circuit 2122. The SL boosting circuit adjusts the SL voltage according to an inputted SL voltage V_SL1 and an inputted boosting voltage V_B2 to output an output SL voltage V_SL. The output SL voltage V_SL is provided to the SL of the at least one RRAM cell.

The BL boosting circuit 2123 is configured adjust the BL voltage applied to at least one RRAM cell being connected to the BL boosting circuit 2123. The BL boosting circuit 2123 adjusts the BL voltage according to an inputted BL voltage V_BL1 and an inputted boosting voltage V_B3 to output an output BL voltage V_BL. The output BL voltage V_BL is provided to the BL of at least one RRAM cell.

In an embodiment of the invention, the WL boosting circuit 2121 is configured to adjust the WL voltage applied to a selected RRAM cell according to the resistance value of the selected RRAM cell. The SL boosting circuit 2122 is configured to adjust the SL voltage applied to a selected RRAM cell according to the resistance value of the selected RRAM cell. The BL boosting circuit 2123 is configured to adjust the BL voltage applied to a selected RRAM cell according to the resistance value for the selected RRAM cell. For example, the at least one of the WL voltage, SL voltage and BL voltage applied to the selected RRAM cell is adjusted so as to boost the reset voltage for the selected RRAM cell according to the resistance value of the RRAM cell.

Figure 3A:
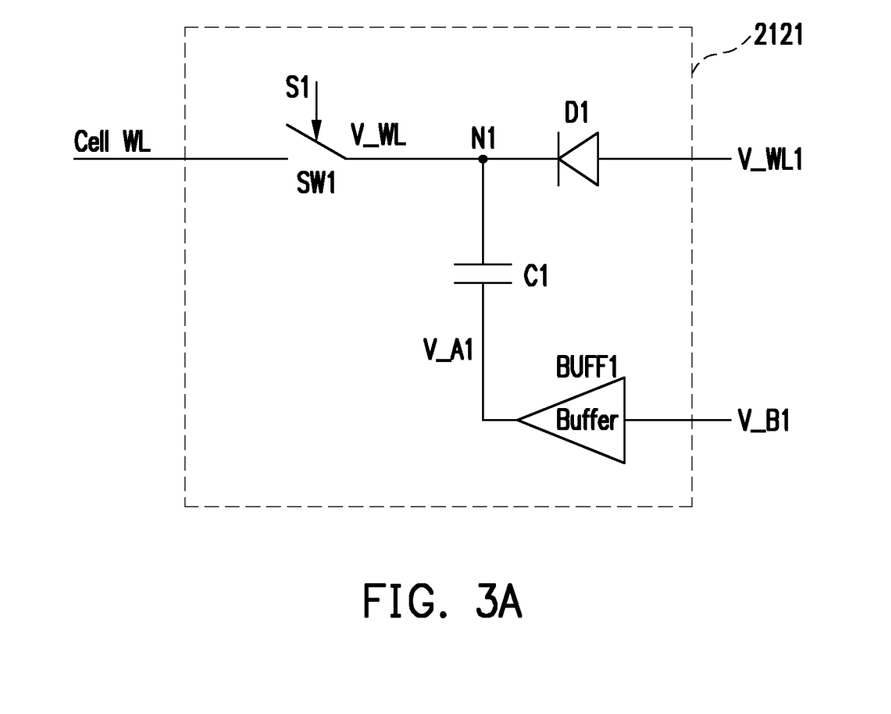
FIG. 3A is a schematic diagram illustrating a word-line boosting circuit of a RRAM device according to an embodiment of the invention.

Referring to FIG. 3A, the WL boosting circuit 2121 may include a diode D1, a buffer BUFF1, a capacitor C1 and a switch SW1. The diode D1 has an anode terminal and a cathode terminal, where the anode terminal is configured to receive the input WL voltage V_WL1 and the cathode terminal is coupled to a connection node N1 among the diode D1, the capacitor C1 and the switch SW1. In an embodiment of the invention, the diode D1 may be replaced with a similar-function circuit or component such as a negative metal-oxide-semiconductor (NMOS) transistor, where the negative NMOS may have a negative threshold voltage.

The buffer BUFF1 has an input terminal and an output terminal. The input terminal of the buffer BUFF1 receives the boosting voltage V_B1 and an output terminal of the buffer BUFF1 is coupled to one terminal of the capacitor C1. The capacitor C1 is coupled between the connection node N1 and the buffer BUFF1. The switch SW1 is coupled between the connection node N1 and the WL of at least one RRAM cell, and is controlled to switched on or off according to a control signal S1. The control signal S1 may be provided by the controller 140 shown in FIG. 1.

The buffer BUFF1 provides the voltage V_A1 to charge the capacitor C1, and the capacitor C1 may discharge the stored energy in the capacitor C1 to boost the WL voltage. In this way, the WL boosting circuit 2121 may boost the voltage level of the WL voltage according to the input WL voltage V_WL1 and the boosting voltage V_B1. The switch SW1 may be switched on or off according to the control signal S1 to provide the boosted WL voltage V_WL to the WL of the at least one RRAM cell.

Figure 3B:
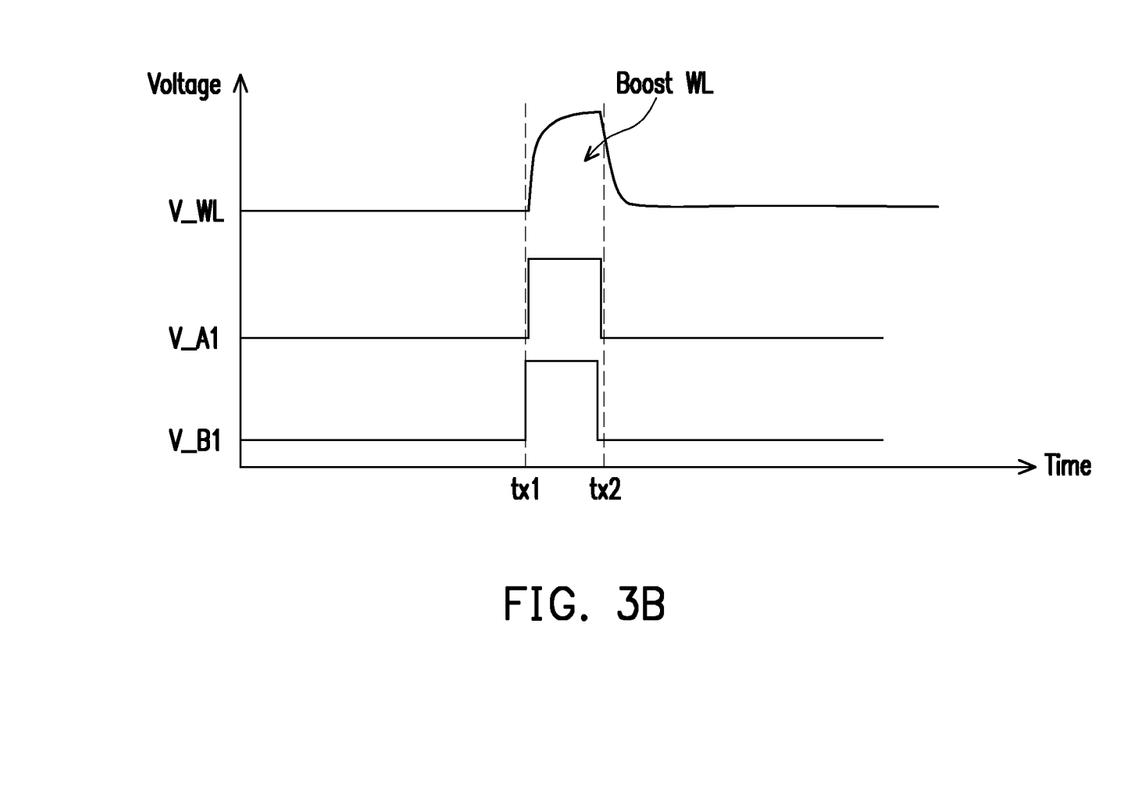
FIG. 3B is an exemplary waveform diagram illustrating signals of the word-line boosting circuit as shown in FIG. 3A according an embodiment of the invention.

Referring to FIG. 3A and FIG. 3B, the waveforms of the output WL voltage V_WL and the voltages V_B1 and V_A1 in the WL boosting circuit 2121 in FIG. 3A are illustrated. Before the time point tx1, the voltages V_B1 and V_A1 are in a low voltage level and the WL voltage is not boosted (the output WL voltage V_WL is the same as the input WL voltage V_WL1). During the time period from tx1 to tx2, the voltages V_B1 and V_A1 rises to a high voltage level and the WL voltage is boosted to a higher voltage level. The level of the boosted WL voltage and the length of the boosting period may be determined according to the resistance value of the RRAM cell that is connected to the WL boosting circuit 2121. After the time point tx2, the voltage level of the WL voltage reduces back to the level of the input WL voltage V_WL1.

Figure 4A:
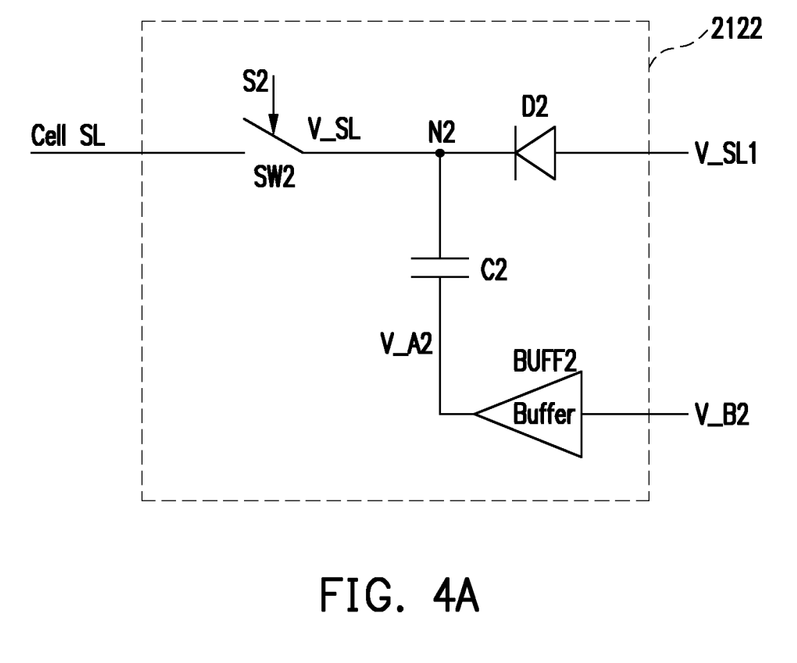
FIG. 4A is an exemplary schematic diagram illustrating a source-line boosting circuit of a RRAM device according to an embodiment of the invention.

Referring to FIG. 4A, the SL boosting circuit 2122 may include a diode D2, a buffer BUFF2, a capacitor C2 and a switch SW2. The diode D2, buffer BUFF2, capacitor C2 and switch SW2 and their coupling relations are substantially the same as those of the diode D1, buffer BUFF1, capacitor C1 and switch SW1 in FIG. 3A, thus the detailed description regarding the diode D2, the buffer BUFF2, the capacitor C2 and the switch SW2 is omitted hereafter.

Figure 4B:
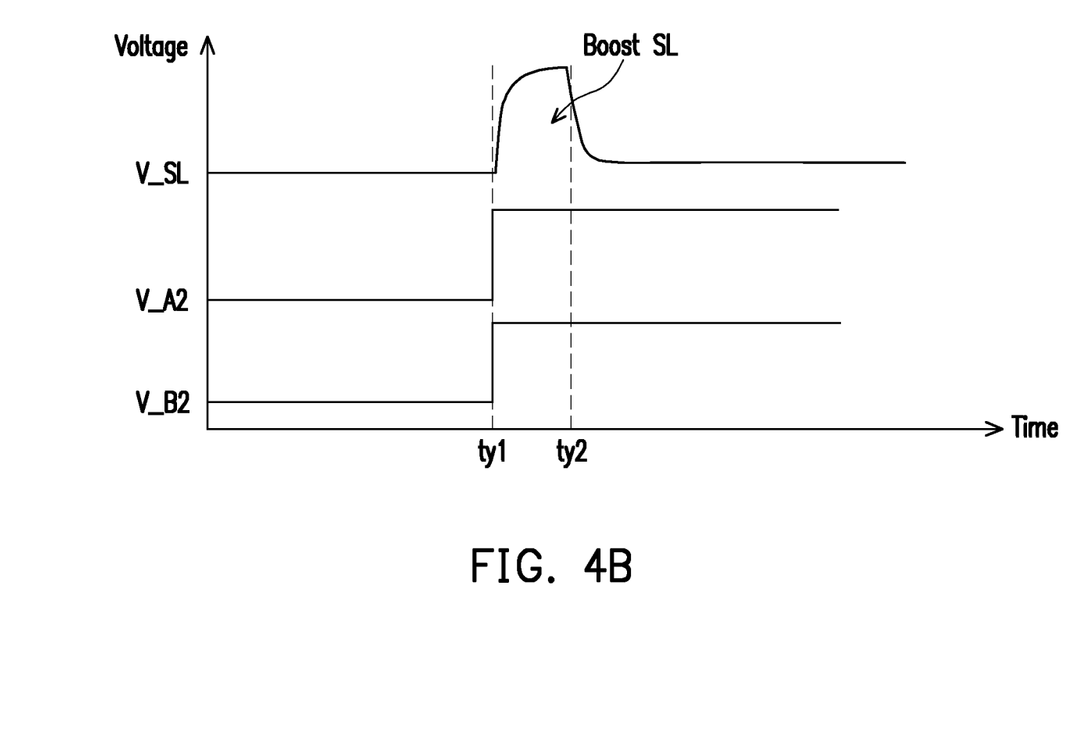
FIG. 4B is an exemplary waveform diagram illustrating signals of the source-line boosting circuit as shown in FIG. 4A according to an embodiment of the invention.

Referring to FIG. 4A and FIG. 4B, the waveforms of the output SL voltage V_SL and the voltages V_B2 and V_A2 in the SL boosting circuit 2122 in FIG. 4A are illustrated. Before the time point ty1, the voltages V_B2 and V_A2 are in a low voltage level and the SL voltage is not boosted (the output SL voltage V_SL is the same as the input SL voltage V_SL1). During the time period from ty1 to ty2, the voltages V_B2 and V_A2 rises to a high voltage level and the SL voltage is boosted to a higher voltage level. The level of the boosted SL voltage and the length of the boosting period may be determined according to the resistance value of the RRAM cell that is connected to the SL boosting circuit 2122. After the time point ty2, the voltage level of the SL voltage reduces back to the level of the input SL voltage V_SL1.

The structure of the BL boosting circuit 2123 may be deduced by analogy, and the detailed description of the BL boosting circuit 2123 are omitted hereafter.

Figure 5A:
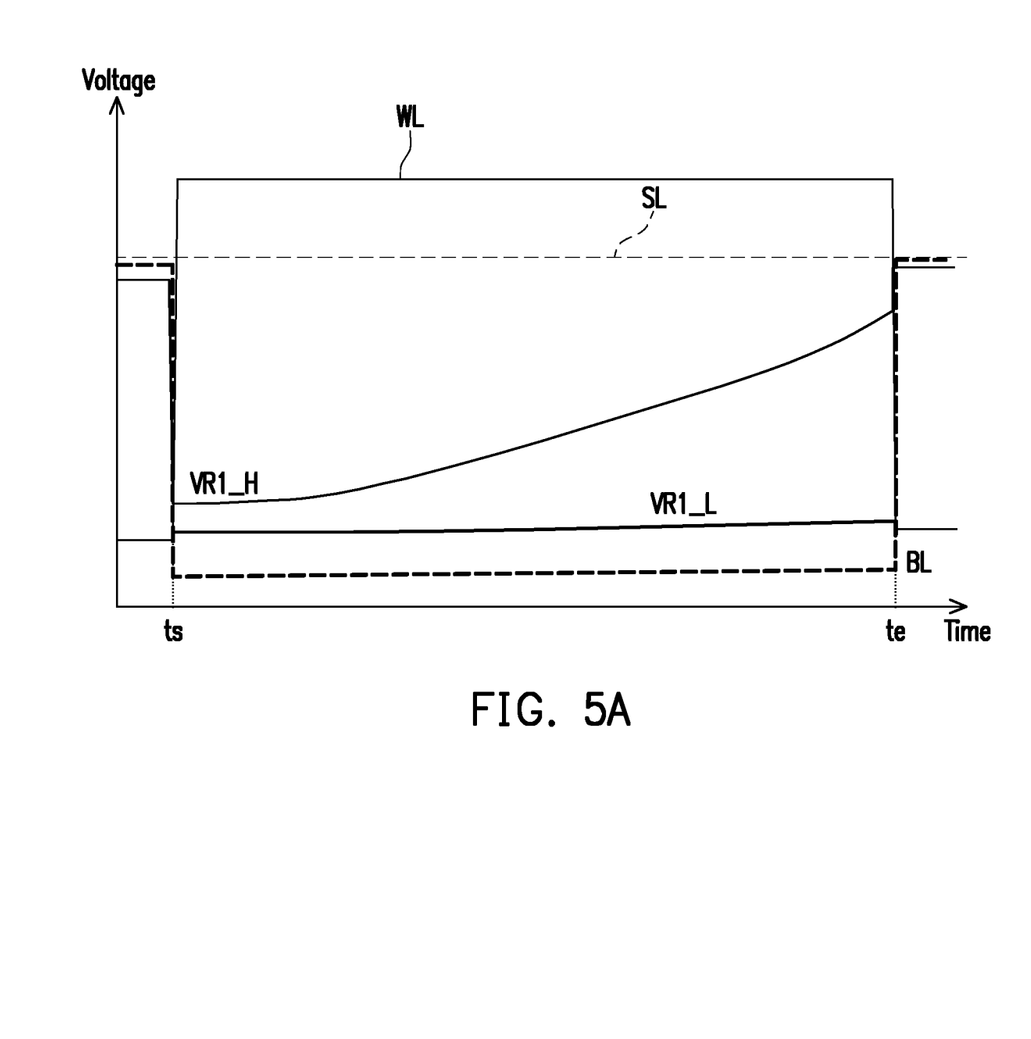
FIG. 5A to FIG. 5D are exemplary waveform diagrams illustrates the reset voltage signals and the related signals in different embodiments of the invention.

Referring to FIG. 5A, waveforms of signals during a reset period for a RRAM cell are illustrated. During the reset period (from ts to te), the voltage levels of the WL voltage, the SL voltage and the BL voltage remain unchanged. If the resistance value of the RRAM cell is large enough (e.g., the resistance value of the RRAM cell is greater than a threshold value), a reset voltage VR1_H increases and almost reach the voltage level of the SL at the end of the reset period. Accordingly, the reset operation is performed successfully on the RRAM cell. However, if the resistance value of the RRAM cell is too small (e.g., the resistance value of the RRAM cell is smaller than a threshold value), a most of the reset voltage VR1_L is dropped on the resistive element of the RRAM cell, thus the remaining reset voltage of VR1_L is not large enough to perform the reset operation successfully.

For example, referring to FIG. 1 and FIG. 5A, a current IR flowing through the RRAM cell is calculated according to equation (1) and the reset voltage VR applied on the terminals of the resistive element is calculated according to equation (2). As shown in the equations (1) and (2), if the resistance value of the RRAM cell R(RRAM) is too small (e.g., for ultralow R(RRAM)), most of the voltage is dropped at the transistor T because of the high R(1T), and the reset voltage VR is too small to trigger the reset operation successfully.

$$IR = \frac{VSL}{R(1T) + R(RRAM)} \quad (1)$$

$$VR = IR * R(RRAM) = \frac{VSL}{R(1T) + R(RRAM)} * R(RRAM) \quad (2)$$

However, the above situation is not occurred for the RRAM cell with relatively large resistance value. Hence, in an embodiment of the present application, the resistance value of the RRAM cell is sensed first. If the resistance value of the RRAM cell is greater than a threshold value, the WL voltage, the SL voltage and the BL voltage as shown in FIG. 5A may be applied to perform the reset operation on the RRAM cell. If the resistance value of the RRAM cell is too smaller (e.g., smaller than a threshold value), then at least one of the WL voltage, SL voltage or BL voltage is adjusted so as to boost the reset voltage to be large enough to trigger the reset operation successfully.

Figure 5B:
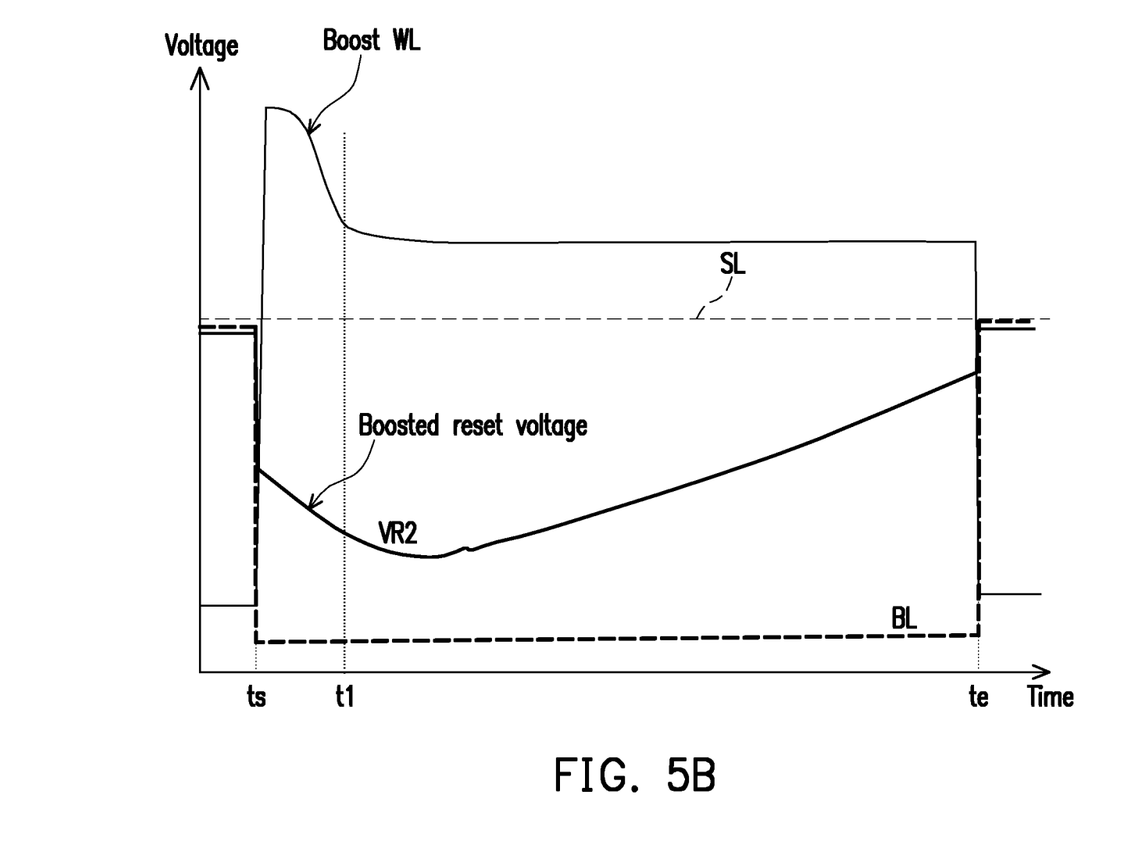

Referring to FIG. 5B, the reset voltage applied to the RRAM cell is boosted by boosting the WL voltage applied to the RRAM cell. In a boosting period (from ts to t1) of the reset period (from ts to te), the WL voltage is boosted to a higher level, thereby boosting the reset voltage VR2 applied to the RRAM cell. The length of the boosting period (from ts to t1) may be shorter than the length of the non-boosting period (t1 to te) of the reset period. The starting point of the boosting period is the same as the starting point of the reset period, but the invention is not limited thereto.

Figure 5C:
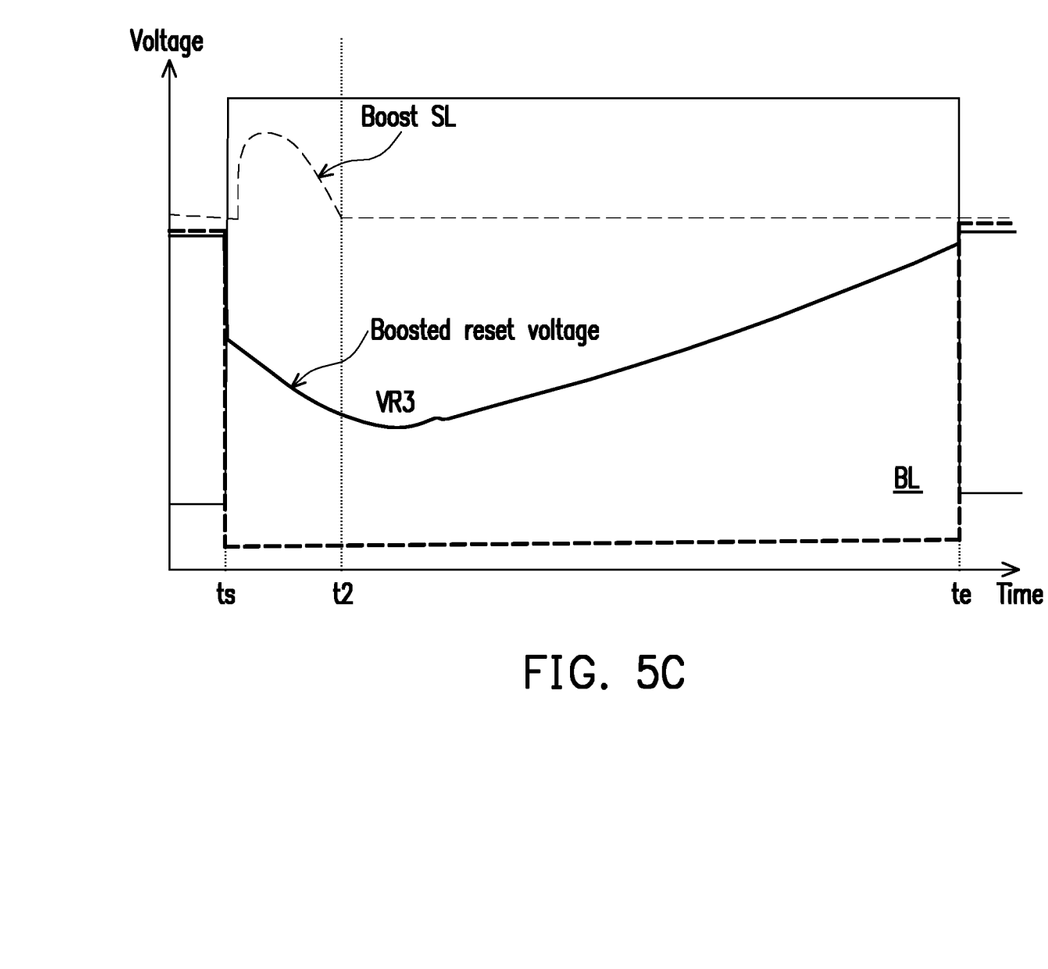

Referring to FIG. 5C, the reset voltage applied to the RRAM cell is boosted by boosting the SL voltage applied to the RRAM cell. In a boosting period (from ts to t2) of the reset period (from ts to te), the SL voltage is boosted to a higher level, thereby boosting the reset voltage VR3 applied to the RRAM cell. The length of the boosting period (from ts to t2) may be shorter than the length of the non-boosting period (t2 to te) of the reset period. The starting point of the boosting period is the same as the starting point of the reset period, but the invention is not limited thereto.

Figure 5D:
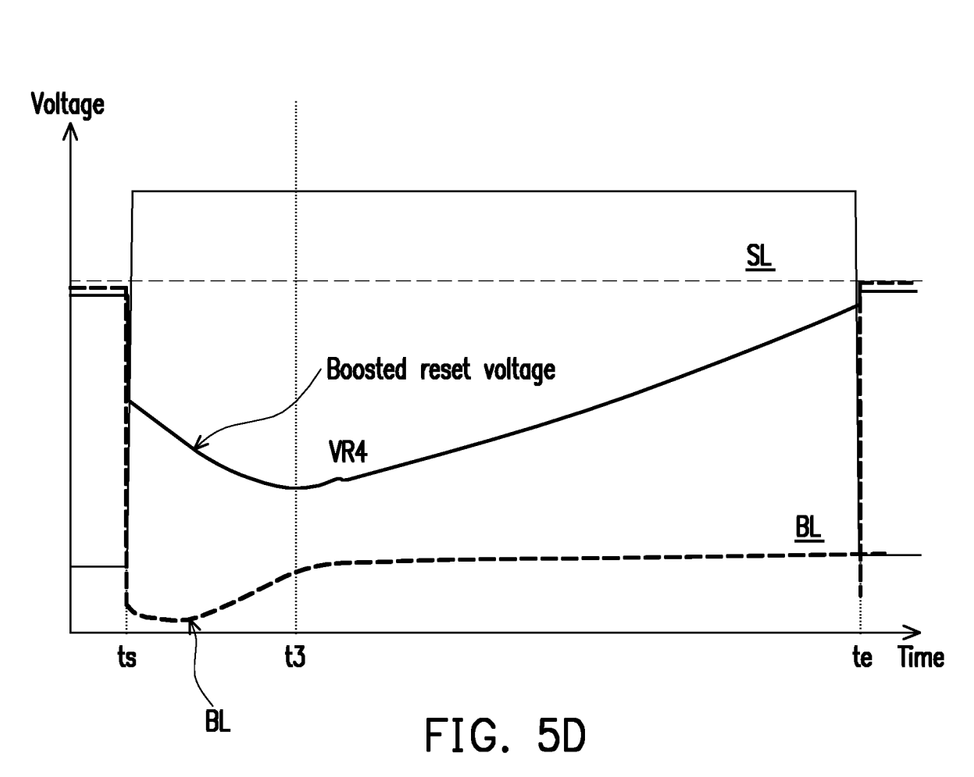

Referring to FIG. 5D, the reset voltage applied to the RRAM cell is boosted by adjusting the BL voltage applied to the RRAM cell. In a boosting period (from ts to t3) of the reset period (from ts to te), the BL voltage is adjusted to a lower level, thereby boosting the reset voltage VR4 applied to the RRAM cell. The length of the boosting period (from ts to t3) may be shorter than the length of the non-boosting period (t3 to te) of the reset period. The starting point of the boosting period is the same as the starting point of the reset period, but the invention is not limited thereto.

The reset voltage applied to the RRAM cell is boosted by boosting at least one of the WL voltage, the SL voltage and the BL voltage. The WL voltage may be boosted by increasing at least one of the level of the WL voltage and the length of the boosting period using the WL boosting circuit as shown in FIG. 2 and FIG. 3A. The SL voltage may be boosted by increasing at least one of the level of the SL voltage and the length of the boosting period using the WL boosting circuit as shown in FIG. 2 and FIG. 4A. The BL voltage may be adjusted by adjusting at least one of the level of the BL voltage and the length of the boosting period.

Figure 6:
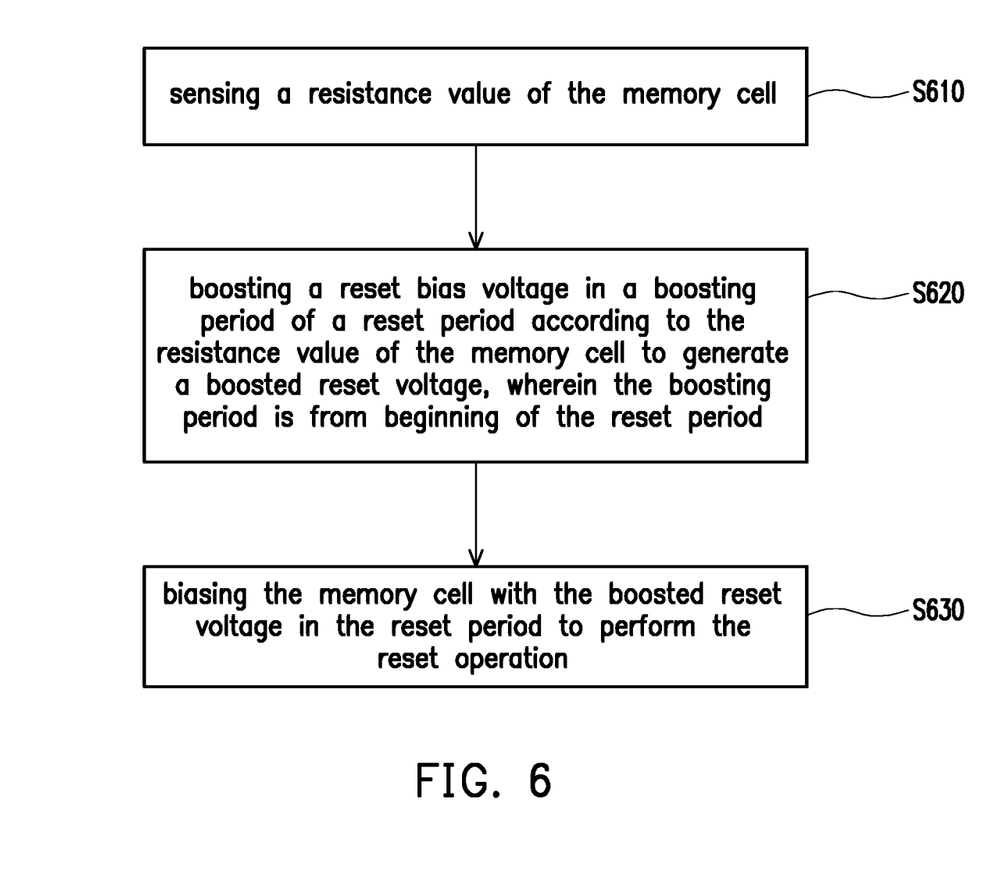
FIG. 6 is a flowchart diagram illustrating a method for a reset operation on a resistive random access memory device according to an embodiment of the invention.

FIG. 6 illustrates a method for a reset operation on a memory cell of a RRAM device according to an embodiment of the invention. In step S610, a resistance value of the memory cell is sensed. In step S620, a reset voltage is boosted in a boosting period of a reset period according to the resistance value of the memory cell to generate a boosted reset voltage, wherein the boosting period is from beginning of the reset period. In steps S630, the memory cell is biased with the boosted reset voltage in the reset period to perform the reset operation.

In summary, the embodiments of the invention introduce a RRAM device and a method for performing memory operations on memory cells of the RRAM device. The resistance value of the memory cell is sensed, and the reset voltage applied to the reset operation on the memory cell is boosted according to the resistance value of the memory cell. The reset voltage may be boosted by adjusting according the resistance value of the memory at least one of the WL voltage, SL voltage and BL voltage applied on the memory cell. In this way, the reset voltage may be boosted to be large enough to trigger the reset operation successfully. Accordingly, the performance and reliability of the RRAM device is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for a reset operation on a resistive random access memory device having a memory cell, comprising:
   sensing a resistance value of the memory cell before a starting point of a reset period and determining whether the resistance value of the memory cell is less than a threshold value;
   when the resistance value of the memory cell is less than the threshold value, boosting a reset voltage in a boosting period of the reset period according to the resistance value of the memory cell to generate a boosted reset voltage, wherein a starting point of the boosting period is same as the starting point of the reset period; and
   biasing the memory cell with the boosted reset voltage in the reset period to perform the reset operation.

2. The method of claim 1, wherein a length of the boosting period and a level of the boosted reset voltage are determined according to the resistance value of the memory cell.

3. The method of claim 2, wherein at least one of the length of the boosting period and the level of the boosted reset voltage increases as the resistance value of the memory cell decreases.

4. The method of claim 1, wherein the boosting period of the reset period is less than a non-boosting period of the reset period.

5. The method of claim 1, wherein a step of boosting the reset voltage in a boosting period of the reset period according to the resistance value of the memory cell comprises:
   boosting a word-line voltage applied to a word-line connected to the memory cell in the boosting period of the reset period, wherein the reset voltage increases as the word-line voltage increases.

6. The method of claim 1, wherein a step of boosting the reset voltage in a boosting period of the reset period according to the resistance value of the memory cell comprises:
   boosting a source-line voltage applied to a source-line connected to the memory cell in the boosting period of the reset period, wherein the reset voltage increases as the source-line voltage increases.

7. The method of claim 1, wherein a step of boosting the reset voltage in a boosting period of the reset period according to the resistance value of the memory cell comprises:
   lowering a bit-line voltage applied to a bit-line connected to the memory cell in the boosting period of the reset period, wherein the reset voltage increases as the bit-line voltage decrease.

8. The method of claim 1, wherein
   the reset operation is performed on a plurality of the memory cells of the resistive random access memory device simultaneously,
   a first reset voltage applied to a first memory cell among the plurality of the memory cells is different from a second reset voltage applied to a second memory cell among the plurality of the memory cell.

9. A resistive random access memory device, comprising:
   a resistive random access memory array having a memory cell;
   a sense amplifier, coupled to the resistive random access memory array, configured to sense a resistance value of the memory cell before a starting point of a reset period;
   a boosting circuit, coupled to the memory cell, configured to determine whether the resistance value of the memory cell is less than a threshold value before the starting point of the reset period, when the resistance value of the memory cell is less than the threshold value, boost a reset voltage in a boosting period of the reset period according to the resistance value of the memory cell to generate a boosted reset voltage, wherein a starting point of the boosting period is same as the starting point of the reset period, and the memory cell is biased with the reset voltage in the reset period to perform the reset operation.

10. The resistive random access memory device of claim 9, wherein a length of the boosting period and a level of the boosted reset voltage are determined according to the resistance value of the memory cell.

11. The resistive random access memory device of claim 10, wherein at least one of the length of the boosting period and the level of the boosted reset voltage increases as the resistance value of the memory cell decreases.

12. The resistive random access memory device of claim 9, wherein the boosting period of the reset period is less than a non-boosting period of the reset period.

13. The resistive random access memory device of claim 9, wherein the boosting circuit comprises at least one of a word-line boosting circuit, a source-line boosting circuit and a bit-line boosting circuit, wherein each of the word-line boosting circuit, the source-line boosting circuit and the bit-line bias boosting circuit comprises:
   a diode, having an anode terminal and a cathode terminal, wherein the anode terminal receives a first bias voltage;
   a capacitor, having first terminal and a second terminal, wherein the first terminal of the capacitor is coupled to the cathode terminal of the diode via connection node; and
   a switch, coupled between the memory cell and the connection node between the first terminal of the capacitor and the cathode terminal of the diode.

14. The resistive random access memory device of claim 13, wherein the first bias voltage has a constant voltage level.

15. The resistive random access memory device of claim 13, wherein the switch is controlled by a control signal.

16. The resistive random access memory device of claim 13, wherein each of the word-line boosting circuit, the source-line boosting circuit and the bit-line bias boosting circuit further comprises:
   a buffer, coupled to the second terminal of the capacitor, configured to receive a boosting voltage and output a voltage to charge the capacitor.

17. The resistive random access memory device of claim 9, further comprising:
   a write driver circuit, configured to drive a plurality of memory cells of the resistive random access memory array simultaneously, wherein a first reset voltage applied to a first memory cell among the plurality of the memory cells is different from a second reset voltage applied to a second memory cell among the plurality of the memory cell.

18. The resistive random access memory device of claim 17, wherein the boosting circuit is included in the write driver circuit.

* * * * *

UNITED STATES PATENT AND TRADEMARK OFFICE
CERTIFICATE OF CORRECTION

| | | |
|---|---|---|
| PATENT NO. | : 10,748,611 B2 | Page 1 of 1 |
| APPLICATION NO. | : 16/178602 | |
| DATED | : August 18, 2020 | |
| INVENTOR(S) | : Koying Huang | |

It is certified that error appears in the above-identified patent and that said Letters Patent is hereby corrected as shown below:

On the Title Page

Item (73) Assignee should read:
Winbond Electronics Corp., Taichung (TW)

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*